US012712584B2

(12) United States Patent
Daimon et al.

(10) Patent No.: US 12,712,584 B2
(45) Date of Patent: *Aug. 18, 2026

(54) RADIO-FREQUENCY MODULE AND COMMUNICATION DEVICE

(71) Applicant: Murata Manufacturing Co., Ltd., Nagaokakyo (JP)

(72) Inventors: Yoshihiro Daimon, Nagaokakyo (JP); Hiromichi Kitajima, Nagaokakyo (JP); Kiyoshi Aikawa, Nagaokakyo (JP); Takashi Yamada, Nagaokakyo (JP); Takanori Uejima, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 299 days.

This patent is subject to a terminal disclaimer.

(21) Appl. No.: 18/477,579

(22) Filed: Sep. 29, 2023

(65) Prior Publication Data

US 2024/0022276 A1 Jan. 18, 2024

Related U.S. Application Data

(63) Continuation of application No. PCT/JP2022/010801, filed on Mar. 11, 2022.

(30) Foreign Application Priority Data

Mar. 31, 2021 (JP) ................................ 2021-060066

(51) Int. Cl.

*H04B 1/38* (2015.01)
*H03F 1/30* (2006.01)
*H03F 3/24* (2006.01)

(52) U.S. Cl.

CPC ................ *H04B 1/38* (2013.01); *H03F 1/30* (2013.01); *H03F 3/245* (2013.01); *H03F 2200/451* (2013.01)

(58) Field of Classification Search

None

See application file for complete search history.

(56) References Cited

U.S. PATENT DOCUMENTS 10,192,831 B1 * 1/2019 Kim .................... H01L 23/5389
10,256,192 B2 * 4/2019 Yi ........................ H01L 23/5389
(Continued)

FOREIGN PATENT DOCUMENTS

JP 2003-060523 A 2/2003
JP 2016-103540 A 6/2016
(Continued)

OTHER PUBLICATIONS

International Search Report and Written Opinion mailed on Jun. 7, 2022, received for PCT Application PCT/JP2022/010801, filed on Mar. 11, 2022, 11 pages including English Translation.

*Primary Examiner* — Pablo N Tran
(74) *Attorney, Agent, or Firm* — XSENSUS LLP

(57) ABSTRACT

A radio-frequency module includes a module substrate having major surfaces that are opposite to each other; a module substrate having major surfaces that are opposite to each other, the major surface being disposed facing the major surface; a plurality of electronic components disposed between the major surfaces, on the major surface, and on the major surface; and a plurality of external connection terminals disposed on the major surface. The plurality of electronic components include a power amplifier. The power amplifier includes major surfaces that are opposite to each other and a circuit section that is formed at a position closer to the major surface than the major surface, and includes an amplification transistor. The power amplifier has the major surface disposed facing the major surface, and a heat dissipation conductor extending along a direction from the major surface to the major surface is joined to the major surface.

15 Claims, 7 Drawing Sheets

(56) References Cited

U.S. PATENT DOCUMENTS

| | | | | |
|---|---|---|---|---|
| 12,506,500 | B2 * | 12/2025 | Aikawa | H04B 1/036 |
| 2003/0107459 | A1 * | 6/2003 | Takahashi | H01P 1/2088<br>333/230 |
| 2007/0254411 | A1 * | 11/2007 | Uhland | H01L 25/0652<br>257/E23.098 |
| 2014/0060897 | A1 * | 3/2014 | Davidsson | H04B 1/00<br>174/252 |
| 2018/0061807 | A1 * | 3/2018 | Lee | H01L 23/5386 |
| 2018/0145050 | A1 * | 5/2018 | Lu | H01L 25/0655 |
| 2019/0378801 | A1 * | 12/2019 | Leitgeb | H01Q 1/526 |
| 2021/0311245 | A1 * | 10/2021 | Hasegawa | G02B 6/0068 |
| 2024/0015914 | A1 * | 1/2024 | Daimon | H03F 3/195 |

FOREIGN PATENT DOCUMENTS

| | | | |
|---|---|---|---|
| WO | 2020/022180 | A1 | 1/2020 |
| WO | 2020/090557 | A1 | 5/2020 |
| WO | 2021/002156 | A1 | 1/2021 |
| WO | 2021/039076 | A1 | 3/2021 |
| WO | 2021/044691 | A1 | 3/2021 |

* cited by examiner

RADIO-FREQUENCY MODULE AND COMMUNICATION DEVICE

CROSS-REFERENCE TO RELATED APPLICATIONS

This is a continuation application of PCT/JP2022/010801, filed on Mar. 11, 2022, designating the United States of America, which is based on and claims priority to Japanese Patent Application No. JP 2021-060066 filed on Mar. 31, 2021. The entire contents of the above-identified applications, including the specifications, drawings and claims, are incorporated herein by reference in their entirety.

TECHNICAL FIELD

The present disclosure relates to a radio-frequency module and a communication device.

BACKGROUND ART

In mobile communication devices, such as cellular phones, radio-frequency front-end modules are becoming more and more complicated with an increasing number of bands to be supported in particular. Patent Document 1 discloses a technique to reduce the size of a radio-frequency module by using two module substrates.

CITATION LIST

Patent Document

Patent Document 1: International Publication No. WO 2020/022180

SUMMARY OF DISCLOSURE

Technical Problem

According to the aforementioned technique in the related art, however, as the size of the radio-frequency module is reduced, the mounting density of the electronic components included in the radio-frequency module increases, and thus the temperature of the electronic components in the vicinity of high-output power amplifiers rises, degrading the high frequency characteristics.

An object of the present disclosure is to provide a radio-frequency module and a communication device that can be reduced in size and can increase heat dissipation of power amplifiers.

Solution to Problem

A radio-frequency module according to an aspect of the present disclosure includes: a first module substrate including a first major surface and a second major surface that are opposite to each other; a second module substrate including a third major surface and a fourth major surface that are opposite to each other, the third major surface being disposed facing the second major surface; a plurality of electronic components disposed between the second major surface and the third major surface, on the first major surface, and on the fourth major surface; and a plurality of external connection terminals disposed on the fourth major surface. The plurality of electronic components include a power amplifier. The power amplifier includes a fifth major surface and a sixth major surface that are opposite to each other and a circuit section that is formed at a position closer to the fifth major surface than the sixth major surface, and includes an amplification transistor. The power amplifier has the fifth major surface disposed facing the second major surface or the fourth major surface. A heat dissipation conductor extending along a direction from the third major surface to the fourth major surface is joined to the sixth major surface.

A radio-frequency module according to an aspect of the present disclosure includes: a module substrate including a first major surface and a second major surface that are opposite to each other; a plurality of electronic components disposed on the first major surface and on the second major surface; a plurality of external connection terminals disposed on the second major surface; and a power amplifier disposed inside the module substrate. The power amplifier includes a third major surface and a fourth major surface that are opposite to each other and a circuit section that is formed at a position closer to the third major surface than the fourth major surface, and includes an amplification transistor. The power amplifier has the third major surface disposed closer to the first major surface than the fourth major surface. A heat dissipation conductor extending along a direction from the first major surface to the second major surface is joined to the fourth major surface.

Advantageous Effects of Disclosure

The radio-frequency module according to an aspect of the present disclosure can be reduced in size and can increase the heat dissipation of the power amplifiers.

DESCRIPTION OF EMBODIMENTS

Figure 1:
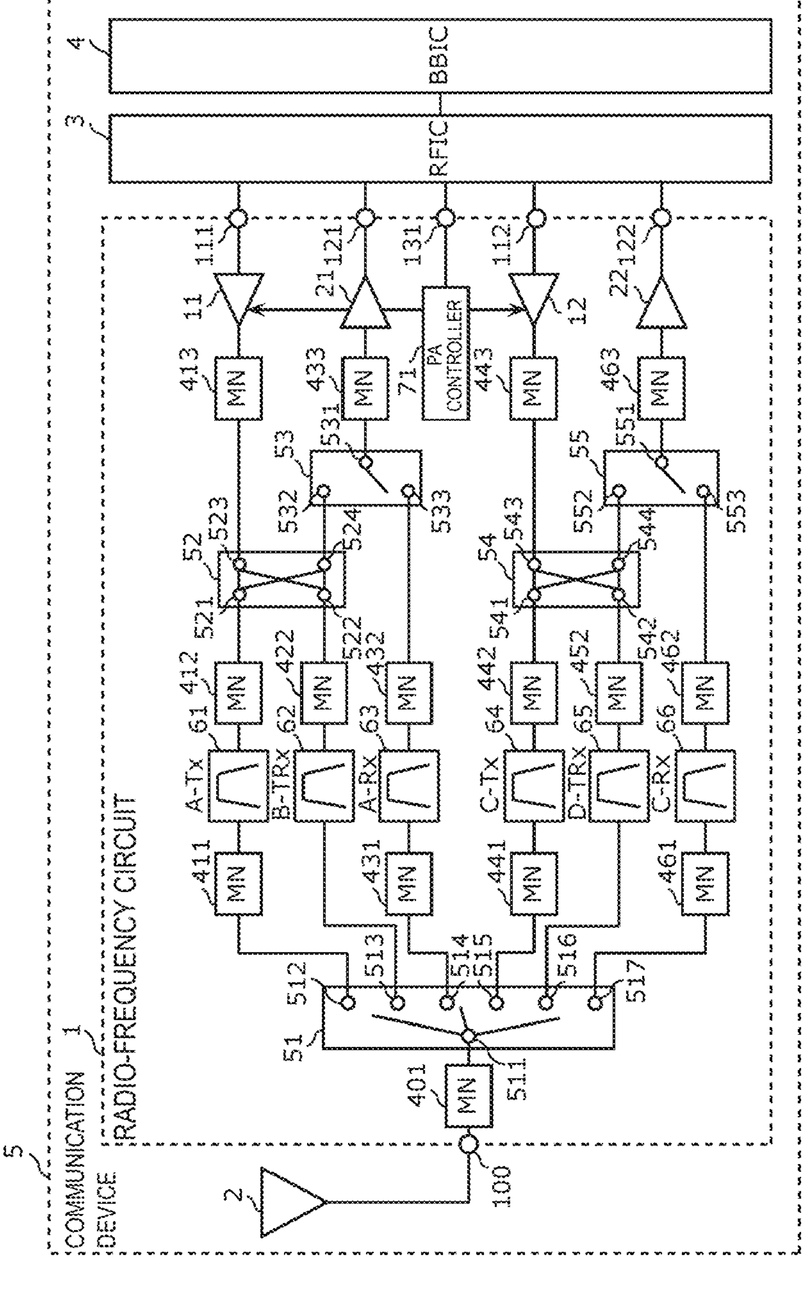
FIG. 1 is a circuit diagram of a radio-frequency circuit and a communication device according to an embodiment.

Hereinafter, an embodiment of the present disclosure is described in detail using the drawings. The embodiment described below illustrates a comprehensive or specific example. The numerical values, shapes, materials, constituent components, arrangements and connections of the constituent components, and the like described in the following embodiment are illustrative only and will not limit the present disclosure.

Each drawing is a schematic diagram including proper emphases, omissions, or adjustment of proportions in order to show the present disclosure and is not always illustrated exactly. The shapes, positional relationships, and proportions in each drawing are sometimes different from actual ones. In the drawings, substantially identical configurations are denoted by the same reference numerals, and redundant description may be omitted or simplified.

In each drawing below, x- and y-axes are orthogonal to each other on a plane parallel to the major surfaces of a module substrate. Specifically, when the module substrate is rectangular in a planar view, the x-axis is parallel to a first side of the module substrate, and the y-axis is parallel to a second side of the module substrate that is orthogonal to the first side. z-axis is vertical to the major surfaces of the module substrate, and the positive z-axis direction thereof is an upward direct while the negative z-axis direction is a downward direction.

In the circuit configuration of the present disclosure, "to be coupled" includes not only to be directly coupled with a connection terminal and/or a trace conductor but also to be electrically coupled via another circuit element. "To be coupled between A and B" indicates to be coupled to both A and B between A and B and includes, in addition to be coupled in series to a path connecting A and B, to be coupled in parallel between the path and ground (shunt connection).

In a component arrangement of the present disclosure, a "planar view" refers to a view of an object orthogonally projected onto an x-y plane as seen in the negative z-axis direction. "A overlaps B in a planar view" means that the region of A orthogonally projected onto the x-y plane overlaps the region of B orthogonally projected onto the x-y plane. "A is disposed between B and C" means that at least one of plural line segments connecting any point within B and any point within C passes through A. "A is joined to B" means that A is physically coupled to B. Terms indicating relationships between elements, such as "parallel" or "vertical", terms indicating element shapes, such as "rectangular", and numerical ranges express not only their exact meaning but also substantially equivalent ranges, for example, including several percent errors.

In component arrangements of the present disclosure, "a component is disposed in a substrate" includes the component being disposed on a major surface of the substrate and the component being disposed within the substrate. "A component is disposed on a major surface of a substrate" includes not only the component being disposed in contact with a major surface of the substrate but also the component being disposed on a major surface side without being in contact with the major surface (for example, the component is stacked atop another component disposed in contact with the major surface). In addition, "a component is disposed on a major surface of a substrate" may include the component being within a recess formed in the major surface. "A component is disposed within a substrate" includes not only the component being encapsulated within the module substrate but also the component being partially exposed from the substrate although the component being fully disposed between the major surfaces of the substrate and the component being partially disposed within the substrate. "A component is disposed between two major surfaces" includes not only the component being disposed in contact with both the two major surfaces but also the component being disposed in contact with one of the two major surfaces or disposed without being in contact with either of the two major surfaces.

EMBODIMENT

1 Circuit Configuration of Radio-frequency Circuit 1 and Communication Device 5

The circuit configurations of a radio-frequency circuit 1 and a communication device 5 according to an embodiment are described with reference to FIG. 1. FIG. 1 is a circuit diagram of the radio-frequency circuit 1 and communication device 5 according to the embodiment.

[1.1 Circuit Configuration of Communication Device 5]

First, the circuit configuration of the communication device 5 is described. As illustrated in FIG. 1, the communication device 5 according to the embodiment includes the radio-frequency circuit 1, an antenna 2, a radio frequency integrated circuit (RFIC) 3, and a baseband integrated circuit (BBIC) 4.

The radio-frequency circuit 1 transfers radio-frequency signals between the antenna 2 and the RFIC 3. The internal configuration of the radio-frequency circuit 1 is described later.

The antenna 2 is coupled to an antenna connection terminal 100 of the radio-frequency circuit 1. The antenna 2 transmits a radio-frequency signal outputted from the radio-frequency circuit 1. The antenna 2 receives a radio-frequency signal from the outside and outputs the received radio-frequency signal to the radio-frequency circuit 1.

The RFIC 3 is an example of a signal processing circuit to process radio-frequency signals. Specifically, the RFIC 3 performs signal processing, such as down-conversion, for a radio-frequency reception signal inputted through a reception path of the radio-frequency circuit 1 and outputs to the BBIC 4, the reception signal generated through the signal processing. The RFIC 3 performs signal processing, such as up-conversion, for a transmission signal inputted from the BBIC 4 and outputs a radio-frequency transmission signal generated by the signal processing to a transmission path of the radio-frequency circuit 1. The RFIC 3 includes a controller to control switches, amplifiers, and other elements included in the radio-frequency circuit 1. Part of or all of the functions of the RFIC 3 as a controller may be implemented outside the RFIC 3 and, for example, may be implemented in the BBIC 4 or the radio-frequency circuit 1.

The BBIC 4 is a baseband signal processing circuit that performs signal processing using an intermediate frequency band lower than frequencies of radio-frequency signals transferred by the radio-frequency circuit 1. Examples of the signals to be processed by the BBIC 4 are image signals for image display and/or audio signals for voice calls using a speaker.

In the communication device 5 according to the embodiment, the antenna 2 and BBIC 4 are not essential constituent elements.

[1.2 Circuit Configuration of Radio-Frequency Circuit 1]

Next, the circuit configuration of the radio-frequency circuit 1 is described. As illustrated in FIG. 1, the radio-frequency circuit 1 includes power amplifiers (PAs) 11 and 12, low-noise amplifiers (LNAs) 21 and 22, matching networks (MN) 401, 411 to 413, 422, 431 to 433, 441 to 443, 452, and 461 to 463, switches (SWs) 51 to 55, filters 61 to 66, a PA controller (PAC) 71, the antenna connection terminal 100, radio-frequency input terminals 111 and 112, radio-frequency output terminals 121 and 122, and control terminal 131. Hereinafter, the constituent elements of the radio-frequency circuit 1 are described sequentially.

The antenna connection terminal 100 is coupled to the antenna 2 outside the radio-frequency circuit 1.

Each of the radio-frequency input terminals 111 and 112 is a terminal to receive radio-frequency transmission signals from the outside of the radio-frequency circuit 1. In the embodiment, the radio-frequency input terminals 111 and 112 are coupled to the RFIC 3 outside the radio-frequency circuit 1.

Each of the radio-frequency output terminals 121 and 122 is a terminal to supply radio-frequency reception signals to the outside of the radio-frequency circuit 1. In the embodiment, the radio-frequency output terminals 121 and 122 are coupled to the RFIC 3 outside the radio-frequency circuit 1.

The control terminal 131 are terminals to transfer control signals. Specifically, the control terminal 131 are terminals to receive control signals from the outside of the radio-frequency circuit 1 and/or terminals to supply control signals to the outside of the radio-frequency circuit 1. The control signals are signals concerning control of electronic circuits included in the radio-frequency circuit 1. Specifically, the control signals are digital signals to control at least one of the power amplifiers 11 and 12, low-noise amplifiers 21 and 22, and switches 51 to 55, for example.

The power amplifier 11 is coupled between the radio-frequency input terminal 111 and the filters 61 and 62 and is able to amplify transmission signals in bands A and B. Specifically, the input end of the power amplifier 11 is coupled to the radio-frequency input terminal 111. The output end of the power amplifier 11 is coupled to the filter 61 via the matching network 413, switch 52, and matching network 412. The output end of the power amplifier 11 is also coupled to the filter 62 via the matching network 413, switch 52, and matching network 422.

The power amplifier 12 is coupled between the radio-frequency input terminal 112 and the filters 64 and 65 and is able to amplify transmission signals in bands C and D. Specifically, the input end of the power amplifier 12 is coupled to the radio-frequency input terminal 112. The output end of the power amplifier 12 is coupled to the filter 64 via the matching network 443, switch 54, and matching network 442. The output end of the power amplifier 12 is also coupled to the filter 65 via the matching network 443, switch 54, and matching network 452.

The power amplifiers 11 and 12 are electronic components that provide an output signal having a larger energy than an input signal (a transmission signal) based on power supplied from a power supply. Each of the power amplifiers 11 and 12 includes an amplification transistor and may further include an inductor and/or a capacitor. The internal configuration of the power amplifiers 11 and 12 are not limited. For example, each of the power amplifiers 11 and 12 may be a multistage amplifier, a differential amplifier, or a Doherty amplifier.

The low-noise amplifier 21 is coupled between the filter 62 and 63 and the radio-frequency output terminal 121 and is able to amplify reception signals in the bands A and B. Specifically, the input end of the low-noise amplifier 21 is coupled to the filter 62 via the matching network 433, switches 53 and 52, and matching network 422. The input end of the low-noise amplifier 21 is also coupled to the filter 63 via the matching network 433, switch 53, and matching network 432. The output end of the low-noise amplifier 21 is coupled to the radio-frequency output terminal 121.

The low-noise amplifier 22 is coupled between the filters 65 and 66 and the radio-frequency output terminal 122 and is able to amplify reception signals in the bands C and D. Specifically, the input end of the low-noise amplifier 22 is coupled to the filter 65 via the matching network 463, switches 55 and 54, and matching network 452. The input end of the low-noise amplifier 22 is also coupled to the filter 66 via the matching network 463, switch 55, and matching network 462. The output end of the low-noise amplifier 22 is coupled to the radio-frequency output terminal 122.

The low-noise amplifiers 21 and 22 are electronic components that provide an output signal having a larger energy than that of an input signal (a reception signal) based on power supplied from the power supply. Each of the low-noise amplifiers 21 and 22 includes an amplification transistor and may further include an inductor and/or a capacitor. The internal configurations of the low-noise amplifiers 21 and 22 are not limited.

Each of the matching networks 401, 411 to 413, 422, 431 to 433, 441 to 443, 452, and 461 to 463 is coupled between two circuit elements and is able to provide impedance matching between the two circuit elements. Thus, each of the matching networks 401, 411 to 413, 422, 431 to 433, 441 to 443, 452, and 461 to 463 is an impedance matching network. Each of the matching networks 401, 411 to 413, 422, 431 to 433, 441 to 443, 452, and 461 to 463 includes an inductor and may further include a capacitor.

The matching network 411 is coupled between the switch 51 and the filter 61. The matching network 431 is coupled between the switch 51 and the filter 63. The matching network 441 is coupled between the switch 51 and the filter 64. The matching network 461 is coupled between the switch 51 and the filter 66.

The matching network 412 is coupled between the power amplifier 11 and the filter 61. The matching network 413 is an example of a first inductor and is coupled between the power amplifier 11 and the filters 61 and 62. The matching network 442 is coupled between the power amplifier 12 and the filter 64. The matching network 443 is an example of the first inductor and is coupled between the power amplifier 12 and the filters 64 and 65.

The matching network 401 is coupled between the antenna connection terminal 100 and the switch 51.

The matching network 432 is coupled between the low-noise amplifier 21 and the filter 63. The matching network 433 is coupled between the low-noise amplifier 21 and the filter 63. The matching network 462 is coupled between the low-noise amplifier 22 and the filter 66. The matching network 463 is coupled between the low-noise amplifier 22 and the filter 66.

The switch 51 is coupled between the antenna connection terminal 100 and the filters 61 to 66. The switch 51 includes terminals 511 to 517. The terminal 511 is coupled to the antenna connection terminal 100. The terminal 512 is coupled to the filter 61 via the matching network 411. The terminal 513 is coupled to the filter 62. The terminal 514 is coupled to the filter 63 via the matching network 431. The terminal 515 is coupled to the filter 64 via the matching network 441. The terminal 516 is coupled to the filter 65. The terminal 517 is coupled to the filter 66 via the matching network 461.

In this connection configuration, the switch 51 is able to connect the terminal 511 to at least one of the terminals 512 to 517 based on a control signal from the RFIC 3, for example. The switch 51 is able to switch whether to couple the antenna connection terminal 100 to each of the filters 61 to 66. The switch 51 is composed of a multi-connection switch circuit, for example, and is sometimes referred to as an antenna switch.

The switch 52 is coupled between the output end of the power amplifier 11 and the filters 61 and 62 and is coupled between the input end of the low-noise amplifier 21 and the filter 62. The switch 52 includes terminals 521 to 524. The terminal 521 is coupled to the filter 61 via the matching network 412. The terminal 522 is coupled to the filter 62 via the matching network 422. The terminal 523 is coupled to the output end of the power amplifier 11 via the matching network 413. The terminal 524 is coupled to the input end of the low-noise amplifier 21 via the switch 53 and matching network 433.

In this connection configuration, the switch 52 is able to couple the terminal 523 to at least one of the terminals 521 and 522 and couple the terminal 522 to at least one of the terminals 523 and 524 based on a control signal from the RFIC 3, for example. The switch 52 is able to switch whether to couple the power amplifier 11 to each of the filters 61 and 62 and is able to switch connections between the filter 62 and the power amplifier 11 and between the filter 62 and the low-noise amplifier 21. The switch 52 is composed of a multi-connection switch circuit, for example.

The switch 53 is coupled between the input end of the low-noise amplifier 21 and the filters 62 and 63. The switch 53 includes terminals 531 to 533. The terminal 531 is coupled to the input end of the low-noise amplifier 21 via the matching network 433. The terminal 532 is coupled to the terminal 524 of the switch 52 and is coupled to the filter 62 via the switch 52 and matching network 422. The terminal 533 is coupled to the filter 63 via the matching network 432.

In this connection configuration, the switch 53 is able to couple the terminal 531 to at least one of the terminals 532 and 533 based on a control signal from the RFIC 3, for example. The switch 53 is thus able to switch whether to couple the low-noise amplifier 21 to each of the filters 62 and 63. The switch 53 is composed of a multi-connection switch circuit, for example.

The switch 54 is coupled between the output end of the power amplifier 12 and the filters 64 and 65 and is coupled between the input end of the low-noise amplifier 22 and the filter 65. The switch 54 includes terminals 541 to 544. The terminal 541 is coupled to the filter 64 via the matching network 442. The terminal 542 is coupled to the filter 65 via the matching network 452. The terminal 543 is coupled to the output end of the power amplifier 12 via the matching network 443. The terminal 544 is coupled to the input end of the low-noise amplifier 22 via the switch 55 and matching network 463.

In this connection configuration, the switch 54 is able to couple the terminal 543 to at least one of the terminals 541 and 542 and couple the terminal 542 to either the terminal 543 or 544 based on a control signal from the RFIC 3, for example. The switch 54 is thus able to switch whether to couple the power amplifier 12 to each of the filters 64 and 65 and switch connections between the filter 65 and the power amplifier 12 and between the filter 65 and the low-noise amplifiers 22. The switch 54 is composed of a multi-connection switch circuit, for example.

The switch 55 is coupled between the input end of the low-noise amplifier 22 and the filters 65 and 66. The switch 55 includes terminals 551 to 553. The terminal 551 is coupled to the input end of the low-noise amplifier 22 via the matching network 463. The terminal 552 is coupled to the terminal 544 of the switch 54 and is coupled to the filter 65 via the switch 54 and matching network 452. The terminal 553 is coupled to the filter 66 via the matching network 462.

In this connection configuration, the switch 55 is able to couple the terminal 551 to at least one of the terminals 552 and 553 based on a control signal from the RFIC 3, for example. The switch 55 is thus able to switch whether to couple the low-noise amplifier 22 to each of the filters 65 and 66. The switch 55 is composed of a multi-connection switch circuit, for example.

The filter 61 (A-Tx) is coupled between the power amplifier 11 and the antenna connection terminal 100. Specifically, an end of the filter 61 is coupled to the antenna connection terminal 100 via the matching network 411, switch 51, and matching network 401. The other end of the filter 61 is coupled to the output end of the power amplifier 11 via the matching network 412, switch 52, and matching network 413. The filter 61 has a pass band including an uplink operation band of the band A for frequency division duplex (FDD) and is able to pass transmission signals in the band A.

The filter 62 (B-TRx) is coupled between the antenna connection terminal 100 and the power amplifier 11 and is coupled between the antenna connection terminal 100 and the low-noise amplifier 21. Specifically, an end of the filter 62 is coupled to the antenna connection terminal 100 via the switch 51 and matching network 401. The other end of the filter 62 is coupled to the output end of the power amplifier 11 via the matching network 422, switch 52, and matching network 413 and is coupled to the input end of the low-noise amplifier 21 via the matching network 422, switches 52 and 53, and matching network 433. The filter 62 has a pass band including the band B for time division duplex (TDD) and is able to pass transmission and reception signals in the band B.

The filter 63 (A-Rx) is coupled between the low-noise amplifier 21 and the antenna connection terminal 100. Specifically, an end of the filter 63 is coupled to the antenna connection terminal 100 via the matching network 431, switch 51, and matching network 401. The other end of the filter 63 is coupled to the input end of the low-noise amplifier 21 via the matching network 432, switch 53, and matching network 433. The filter 63 has a pass band including a downlink operation band of the band A for FDD and is able to pass reception signals in the band A.

The filter 64 (C-Tx) is coupled between the power amplifier 12 and the antenna connection terminal 100. Specifically, an end of the filter 64 is coupled to the antenna connection terminal 100 via the matching network 441, switch 51, and matching network 401. The other end of the filter 64 is coupled to the output end of the power amplifier 12 via the matching network 442, switch 54, and matching network 443. The filter 64 has a pass band including an uplink operation band of the band C for FDD and is able to pass transmission signals in the band C.

The filter 65 (D-TRx) is coupled between the antenna connection terminal 100 and the power amplifier 12 and is coupled between the antenna connection terminal 100 and the low-noise amplifier 22. Specifically, an end of the filter 65 is coupled to the antenna connection terminal 100 via the switch 51 and matching network 401. The other end of the filter 65 is coupled to the output end of the power amplifier 12 via the matching network 452, switch 54, and matching network 443 and is coupled to the input end of the low-noise amplifier 22 via the matching network 452, switches 54 and 55, and matching network 463. The filter 65 has a pass band including the band D for TDD and is able to pass transmission and reception signals in the band D.

The filter 66 (C-Rx) is coupled between the low-noise amplifier 22 and the antenna connection terminal 100. Specifically, an end of the filter 66 is coupled to the antenna connection terminal 100 via the matching network 461, switch 51, and matching network 401. The other end of the filter 66 is coupled to the input end of the low-noise amplifier 22 via the matching network 462, switch 55, and matching network 463. The filter 66 has a pass band including a downlink operation band of the band C for FDD and is able to pass reception signals in the band C.

The PA controller 71 is an example of a controller and is able to control the power amplifiers 11 and 12. The PA controller 71 receives digital control signals from the RFIC 3 via the control terminal 131 and outputs control signals to the power amplifiers 11 and 12. The PA controller 71 may further output control signals to the switches 51 to 55 to control the switches 51 to 55.

The bands A to D are frequency bands for communication systems built by using a radio access technology (RAT). The bands A to D are previously defined by a standards body or the like (the 3rd Generation Partnership Project (3GPP) or the Institute of Electrical and Electronics Engineers (IEEE), for example). Examples of the communication systems are a 5th generation new radio (5GNR) system, a long term evolution (LTE) system, and a wireless local area network (WLAN) system.

The bands A and B may be included in a different band group from the bands C and D or may be included in the same band group. Herein, a band group indicates a range of frequencies including plural bands. Band groups can be an ultra-high band group (3300 to 5000 MHz), a high-band group (2300 to 2690 MHz), a mid-band group (1427 to 2200 MHz), and a low-band group (698 to 960 MHz), for example, but are not limited thereto. For example, the band groups may include a band group including an unlicensed band not lower than 5 GHz or a band group in the millimeter wave band.

For example, the bands A and B may be included in the high-band group while the bands C and D are included in the mid-band group. Alternatively, the bands A and B may be included in the mid- or high-band group while the bands C and D are included in the low-band group.

The radio-frequency circuit 1 is illustrated by way of example in FIG. 1 and is not limited thereto. For example, the bands covered by the radio-frequency circuit 1 are not limited to the bands A to D. For example, the radio-frequency circuit 1 may be configured to cover five bands or more. In this case, the radio-frequency circuit 1 may include filters for bands E, F, G . . . . Alternatively, for example, the radio-frequency circuit 1 may be configured to cover the bands A and B but not the bands C and D. In this case, the radio-frequency circuit 1 does not need to include the power amplifier 12, low-noise amplifier 22, matching networks 441 to 443, 452, and 461 to 463, radio-frequency input terminal 112, and radio-frequency output terminal 122. For example, the radio-frequency circuit 1 may be a send-only circuit. In this case, the radio-frequency circuit 1 does not need to include the low-noise amplifiers 21 and 22, matching networks 431 to 433 and 461 to 463, switches 53 and 55, filters 63 and 66, and radio-frequency output terminals 121 and 122. Alternatively, for example, the radio-frequency circuit 1 may be a receive-only circuit. In this case, the radio-frequency circuit 1 does not need to include the power amplifiers 11 and 12, matching networks 411 to 413 and 441 to 443, switches 52 and 54, filters 61 and 64, and radio-frequency input terminals 111 and 112.

The radio-frequency circuit 1 does not need to include all the matching networks 401, 411 to 413, 422, 431 to 433, 441 to 443, 452, and 461 to 463. Furthermore, the radio-frequency circuit 1 may be coupled to plural antennas and may include plural antenna connection terminals, for example. The radio-frequency circuit 1 may include more radio-frequency input terminals. In this case, a switch that is able to switch connections between the power amplifiers and the plural radio-frequency input terminals may be provided between the power amplifiers and the plural radio-frequency input terminals. The radio-frequency circuit 1 may include more radio-frequency output terminals. In this case, a switch that is able to switch connections between the low-noise amplifiers and the plural radio-frequency output terminals may be provided between the low-noise amplifiers and the plural radio-frequency output terminals.

2 Example of Radio-Frequency Circuit 1

[2.1 Example 1]

As Example 1 of the radio-frequency circuit 1 according to the embodiment, a radio-frequency module 1A, in which the radio-frequency circuit 1 is implemented, is described with reference to FIGS. 2 to 5.

[2.1.1 Component Arrangement of Radio-frequency Module 1A]

Figure 2:
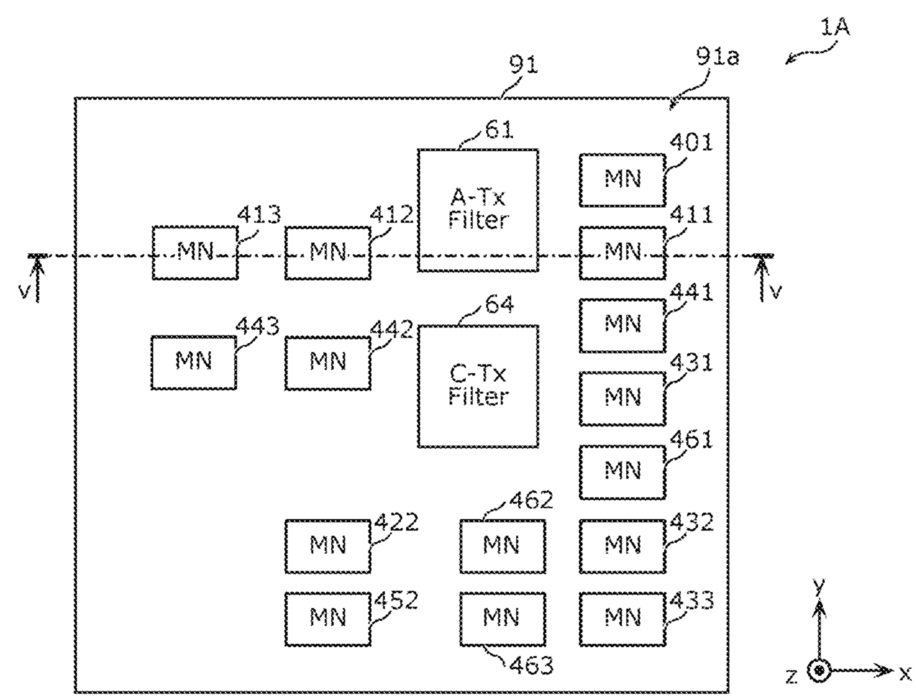
FIG. 2 is a plan view of a first major surface of a radio-frequency module according to Example 1.
Figure 3:
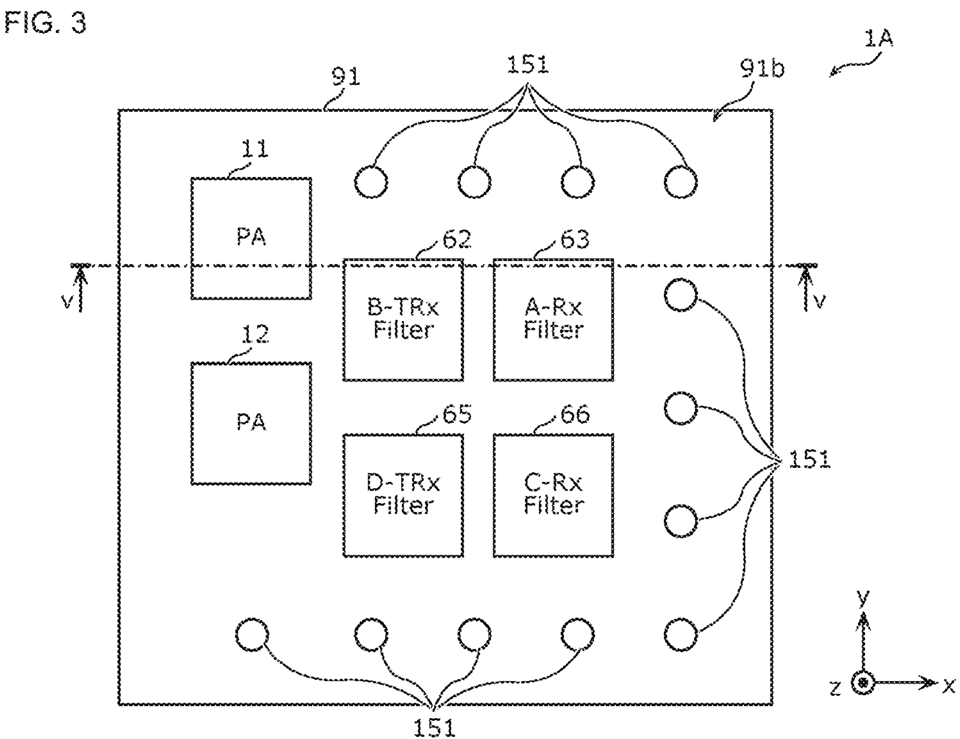
FIG. 3 is a plan view of a second major surface of the radio-frequency module according to Example 1.
Figure 4:
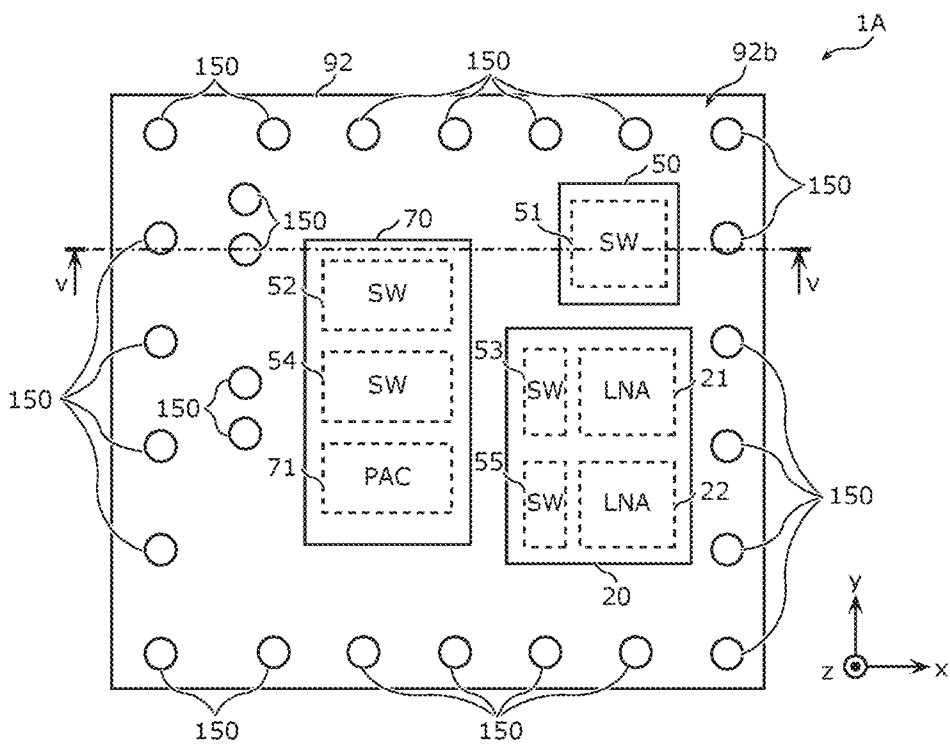
FIG. 4 is a plan view of a fourth major surface of the radio-frequency module according to Example 1.
Figure 5:
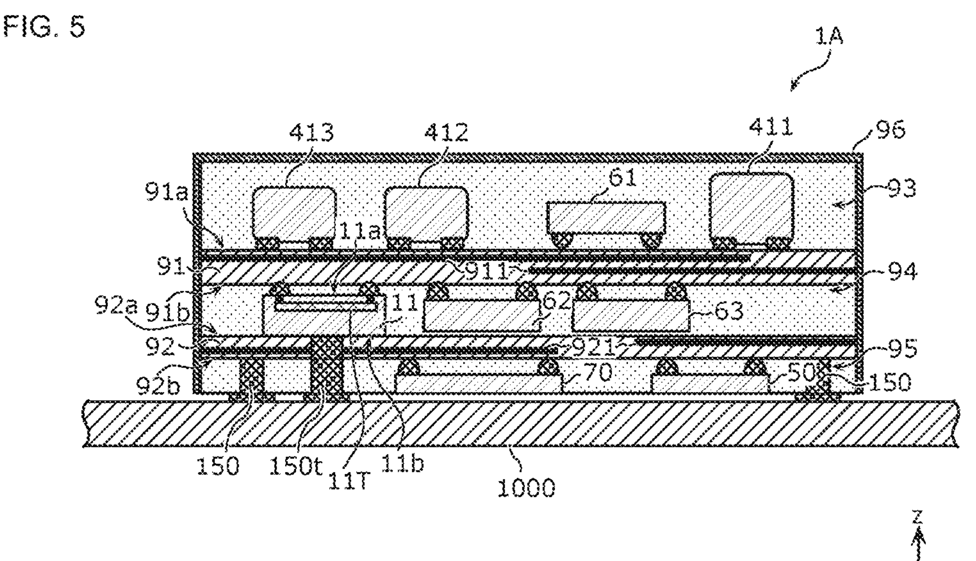
FIG. 5 is a cross-sectional view of the radio-frequency module according to Example 1.

FIG. 2 is a plan view of a major surface 91*a* of the radio-frequency module 1A according to Example 1. FIG. 3 is a plan view of a major surface 91*b* of the radio-frequency module 1A according to Example 1. FIG. 3 is a view seen through the major surface 91*b* side of a module substrate 91 as seen in the positive z-axis direction. FIG. 4 is a plan view of a major surface 92*b* of the radio-frequency module 1A according to Example 1. FIG. 4 is a view seen through the major surface 92*b* side of a module substrate 92 as seen in the positive z-axis direction. FIG. 5 is a cross-sectional view of the radio-frequency module 1A according to Example 1. The cross section of the radio-frequency module 1A in FIG. 5 is taken along a line v-v of FIGS. 2 to 4.

FIGS. 2 to 5 do not illustrate traces connecting plural electronic components disposed in the module substrates 91 and 92. FIGS. 2 to 4 do not illustrate resin members 93 to 95 covering plural electronic components and a shield electrode layer 96, which covers the surfaces of the resin members 93 to 95.

In addition to the plural electronic components including the plural circuit elements illustrated in FIG. 1, the radio-frequency module 1A includes the module substrates 91 and 92, the resin members 93 to 95, the shield electrode layer 96, plural external connection terminals 150, plural heat dissipation conductors 150*t*, and plural inter-substrate connection terminals 151.

The module substrate 91 is an example of a first module substrate and includes the major surfaces 91*a* and 91*b*, which are opposite to each other. The major surfaces 91*a* and 91*b* are examples of first and second major surfaces, respectively.

The module substrate 92 is an example of a second module substrate and includes the major surfaces 92*a* and 92*b*, which are opposite to each other. The major surfaces 92*a* and 92*b* are examples of third and fourth major surfaces, respectively.

The module substrates 91 and 92 are disposed so that the major surface 91*b* of the module substrate 91 faces the major surface 92*a* of the module substrate 92. The module substrates 91 and 92 are disposed at such a distance that the electronic components can be disposed between the major surfaces 91*b* and 92*a*. The plural electronic components are disposed in the two module substrates 91 and 92 and, specifically, are separated into three layers: between the major surfaces 91*b* and 92*a*; on the major surface 91*a*; and on the major surface 92*b*.

A ground conductor 911 may be formed inside the module substrate 91 in a direction parallel to the major surfaces 91*a* and 91*b*. This enhances the isolation between the electronic components disposed on the major surface 91*a* and the electronic components disposed on the major surface 91*b*. A ground conductor 921 may also be formed inside the module substrate 92 in a direction parallel to the major surfaces 92*a* and 92*b*. This enhances the isolation between the electronic components disposed on the major surface 92*a* and the electronic components disposed on the major surface 92*b*.

In FIGS. 2 to 5, the module substrates 91 and 92 have rectangular shapes of the same size in a planar view. The module substrates 91 and 92 may have different sizes and/or different shapes. The shapes of the module substrates 91 and 92 are not limited to rectangles.

Each of the module substrates 91 and 92 can be, but not limited to, a low temperature co-fired ceramic (LTCC) substrate or a high temperature co-fired ceramic (HTCC) substrate, which includes a laminate structure of plural dielectric layers, an embedded printed circuit board, a substrate including a redistribution layer (RDL), a printed circuit board, or the like, for example.

On the major surface 91*a* (the upper layer), matching networks 401, 411 to 413, 422, 431 to 433, 441 to 443, 452, and 461 to 463, and the filters 61 and 64 are disposed.

Each of the matching networks 401, 411 to 413, 422, 431 to 433, 441 to 443, 452, and 461 to 463 is composed of a chip inductor, for example. The chip inductors are surface mount devices (SMDs) each constituting an inductor.

Each matching network may include not only a chip inductor but also a chip capacitor, and the positions of the chip capacitors are not limited. All the matching networks are not necessarily surface-mounted. For example, an inductor and/or a capacitor included in any matching network may be formed within the module substrate 91 and/or 92.

The filters 61 and 64 may be composed of, but not limited to, any one of a surface acoustic wave (SAW) filter, a bulk acoustic wave (BAW) filter, an LC resonance filter, and a dielectric filter, for example.

The resin member 93 covers the major surface 91*a* and the electronic components on the major surface 91*a*. The resin member 93 has a function of enhancing the reliability, including mechanical strength and moisture resistance, of the electronic components on the major surface 91*a*. The resin member 93 does not need to be included in the radio-frequency module 1A.

Between the major surfaces 91*b* and 92*a* (the middle layer), the power amplifiers 11 and 12, the filters 62, 63, 65, and 66, and the plural inter-substrate connection terminals 151 are disposed. Between the major surfaces 91*b* and 92*a*, the resin member 94 is injected and covers the electronic components disposed between the major surfaces 91*b* and 92*a*.

Each of the power amplifiers 11 and 12 includes an amplification transistor. The amplification transistor of the power amplifier 11 is formed in a circuit section 11T. As illustrated in FIG. 5, the circuit section 11T is formed at a position near the major surface 11*a* between the major surfaces 11*a* (fifth major surface) and 11*b* (sixth major surface) of the power amplifier 11, which face each other. The power amplifier 11 has the major surface 11*a* disposed facing the major surface 91*b*. Similarly, the amplification transistor of the power amplifier 12 is formed in a circuit section 12T. Although not illustrated, the circuit section 12T is formed at a position near the major surface 12*a* between the major surfaces 12*a* (fifth major surface) and 12*b* (sixth major surface) of the power amplifier 12, which face each other. The power amplifier 12 has the major surface 12*a* disposed facing the major surface 91*b*.

The power amplifiers 11 and 12 are composed of complementary metal oxide semiconductors (CMOSs), for example, and specifically, can be manufactured by a silicon-on-insulator (SOI) process. The power amplifiers 11 and 12 can be thereby manufactured at low cost. The power amplifiers 11 and 12 may be composed of at least one of gallium arsenide (GaAs), silicon germanium (SiGe), and gallium nitride (GaN). This can implement the power amplifiers 11 and 12 of high quality. The semiconductor materials of the power amplifiers 11 and 12 are not limited to the aforementioned materials.

Filters 62, 63, 65, and 66 may be composed of, but not limited to, any one of a SAW filter, a BAW filter, an LC resonance filter, and a dielectric filter, for example.

The plural electronic components (the power amplifiers 11 and 12 and the filters 62, 63, 65, and 66), which are disposed between the major surfaces 91*b* and 92*a*, are electrically coupled to the module substrate 91 with electrodes interposed therebetween. The electrodes are provided on the side facing the module substrate 91.

In a planar view of the module substrate 91, the matching network 413 (first inductor) at least partially overlaps the power amplifier 11, and the matching network 443 (first inductor) at least partially overlaps the power amplifier 12. Thus, a transmission path on the output side of the power amplifiers 11 and 12 can be shortened.

The plural inter-substrate connection terminals 151 are electrodes to electrically couple the module substrates 91 and 92. The inter-substrate connection terminals 151 are composed of copper post electrodes, for example. The shape and material of the inter-substrate connection terminals 151 are not limited thereto.

The resin member 94 covers the major surfaces 91*b* and 92*a* and the electronic components between the major surfaces 91*b* and 92*a*. The resin member 94 has a function of enhancing the reliability, including mechanical strength and moisture resistance, of the electronic components between the major surfaces 91*b* and 92*a*. The resin member 94 does not need to be included in the radio-frequency module 1A.

On the major surface 92*b* (the lower layer), integrated circuits 20, 50, and 70, the plural external connection terminals 150, and the plural heat dissipation conductors 150*t* are disposed.

The plural heat dissipation conductors 150*t* overlap the power amplifiers 11 and 12 in a planar view and serve as heat dissipation electrodes of the power amplifiers 11 and 12. More specifically, as illustrated in FIGS. 4 and 5, the plural heat dissipation conductors 150*t* each have one end joined to the major surface 11*b* of the power amplifier 11 or the major surface 12*b* of the power amplifier 12, and extend along a direction (negative z-axis direction) from the major surface 92*a* to the major surface 92*b*. The plural heat dissipation conductors 150*t* each have the other end exposed from the bottom surface of the resin member 95 and joined to the motherboard 1000 by at least one of a metal electrode and solder. This makes it possible to increase the heat dissipation of the power amplifiers 11 and 12. The heat dissipation conductors 150*t* are composed of, for example, a via conductor having a circular or elliptical cross section parallel to the module substrate 91 and a copper post electrode. However, the shape and material of the heat dissipation conductors 150*t* are not limited thereto.

The power amplifier 11 includes a first base member on the major surface 11*a* side where the circuit section is formed and a second base member on the major surface 11*b* side where the circuit section is not formed. It is preferable that the second base member has a thermal conductivity higher than that of the first base member. The power amplifier 12 includes a first base member on the major surface 12*a* side where the circuit section is formed and a second base member on the major surface 12*b* side where the circuit section is not formed. It is preferable that the second base member has a thermal conductivity higher than that of the first base member.

The integrated circuit 20 includes the low-noise amplifiers 21 and 22 and switches 53 and 55. The circuit elements constituting the low-noise amplifiers 21 and 22 and the switches 53 and 55 are formed on the circuit surface of the integrated circuit 20. The circuit surface can be, for example, the major surface of the integrated circuit 20 facing the module substrate 92. The integrated circuit 70 includes the switches 52 and 54 and the PA controller 71. The circuit elements constituting the switches 52 and 54 and the PA controller 71 are formed on the circuit surface of the integrated circuit 70. The circuit surface can be, for example, the major surface of the integrated circuit 70 facing the module substrate 92. The integrated circuit 50 includes the switch 51. The switch 51 may be included in the integrated circuit 20 or 70.

Each of the integrated circuits 20, 50, and 70 is composed of a CMOS, for example, and specifically, may be manufactured by a SOI process. Each of the integrated circuits 20, 50, and 70 may be composed of at least one of GaAs, SiGe, and GaN. The semiconductor materials of the integrated circuits 20, 50, and 70 are not limited to the aforementioned materials.

The plural external connection terminals 150 include the antenna connection terminal 100, radio-frequency input terminals 111 and 112, radio-frequency output terminals 121 and 122, and control terminal 131, which are illustrated in FIG. 1, and further include ground terminals. The plural external connection terminals 150 are individually joined to input-output terminals, a ground terminal, and/or other terminals on a motherboard 1000, which is laid in the negative z-axis direction with respect to the radio-frequency module 1A. The plural external connection terminals 150 can be copper post electrodes, for example. However, the shape and material of the external connection terminals 150 are not limited thereto.

The resin member 95 covers the major surface 92*b* and the electronic components on the major surface 92*b*. The resin member 95 has a function of enhancing the reliability, including mechanical strength and moisture resistance, of the electronic components on the major surface 92*b*. The resin member 95 does not need to be included in the radio-frequency module 1A.

The shield electrode layer 96 is a metallic thin film formed by sputtering, for example. The shield electrode layer 96 is formed so as to cover the upper surface of the resin member 93 and lateral faces of the resin members 93 to 95 and module substrates 91 and 92. The shield electrode layer 96 is coupled to the ground and inhibits external noise from entering the electronic components constituting the radio-frequency module 1A. The shield electrode layer 96 does not need to be included in the radio-frequency module 1A.

In the radio-frequency module 1A according to Example 1, the integrated circuit 70 is disposed on the major surface 91*a* and the power amplifier 11 is disposed on the major surface 91*b*. In a planar view of the module substrate 91, the PA controller 71 and the power amplifier 11 may at least partially overlap each other.

[2.1.2 Effect of Radio-Frequency Module 1A]

As described above, the radio-frequency module 1A according to Example 1 includes: the module substrate 91, which includes the major surfaces 91*a* and 91*b* opposite to each other; the module substrate 92, which includes the major surfaces 92*a* and 92*b* opposite to each other, the major surface 92*a* being disposed facing the major surface 91*b*; the plural electronic components disposed between the major surfaces 91*b* and 92*a*, on the major surfaces 91*a*, and on the major surface 92*b*; and plural external connection terminals 150, which are disposed on the major surface 92*b*. The plural electronic components include the power amplifier 11. The power amplifier 11 has the major surfaces 11*a* and 11*b* facing each other, and includes the circuit section that is formed at a position closer to the major surface 11*a* than the major surface 11*b* and includes the amplification transistor. The power amplifier 11 has the major surface 11*a* disposed facing the major surface 91*b*. The heat dissipation conductors 150*t* extending along the direction from the major surface 92*a* to the major surface 92*b* is joined to the major surface 11*b*.

According to such a configuration, the plural electronic components are disposed in three layers, including between the major surfaces 91*b* and 92*a*, on the major surface 91*a*, and on the major surface 92*b*. This can implement reduction in area of the radio-frequency module 1A in a planar view, that is, reduction in size of the radio-frequency module 1A. Since the power amplifier 11 is disposed between the major surfaces 91*b* and 92*a*, the heat dissipation conductor coupled to the motherboard 1000 can be shortened compared to the case where the power amplifier 11 is disposed on the major surface 91*a*, thus increasing the heat dissipation. Since the heat dissipation path of the power amplifier 11 is not disposed on the major surface 91*a*, electronic components may be disposed in a region on the major surface 91*a* overlapping the power amplifier 11 in a planar view. This can implement reduction in size of the radio-frequency module 1A and can increase the heat dissipation of the power amplifier 11.

In the radio-frequency module 1A according to Example 1, for example, the plural electronic components further include the matching network 413 coupled to the output terminal of the power amplifier 11 and disposed on the major surface 91*a*. In a planar view of the module substrate 91, the matching network 413 and the power amplifier 11 may at least partially overlap each other.

According to such a configuration, the transmission path on the output side of the power amplifier 11 can be shortened. Thus, the transmission loss of transmission signals can be reduced.

In the radio-frequency module 1A according to Example 1, for example, the plural electronic components further include the PA controller 71 that controls the power amplifier 11 and is disposed on the major surface 91*a*. In a planar view of the module substrate 91, the PA controller 71 and the power amplifier 11 may at least partially overlap each other.

According to such a configuration, since the power amplifier 11 and the PA controller 71 are disposed with the module substrate 91 interposed therebetween, the digital control signal inputted and outputted to and from the PA controller 71 can be prevented from flowing into the power amplifier 11 as digital noise. Since the control wiring coupling the power amplifier 11 to the PA controller 71 can be shortened, noise generated from the control wiring can be reduced.

In the radio-frequency module 1A according to Example 1, for example, the power amplifier 11 includes the first base member on the major surface 11*a* side where the circuit section is formed and the second base member on the major surface 11*b* side where the circuit section is not formed. The second base member may have a thermal conductivity higher than that of the first base member.

According to such a configuration, heat generated by the circuit section as a heat source can be dissipated to the motherboard 1000 via the second base member having a high thermal conductivity. This increases the heat dissipation of the radio-frequency module 1A.

For example, the radio-frequency module 1A according to Example 1 may have a bottom surface facing the motherboard 1000. The heat dissipation conductor 150*t* may have one end joined to the major surface 11*b* and the other end exposed from the bottom surface.

According to such a configuration, the heat dissipation conductor 150*t* joined to the power amplifier 11 can be joined directly to the motherboard 1000, thus increasing the heat dissipation of the power amplifier 11.

The communication device 5 according to Example 1 includes: the RFIC 3 that processes radio-frequency signals; and the radio-frequency module 1A that transmits radio-frequency signals between the RFIC 3 and the antenna 2.

According to such a configuration, the communication device 5 can achieve the effect of the radio-frequency module 1A.

[2.2 Example 2]

Next, a radio-frequency module 1B, in which the radio-frequency circuit 1 is implemented, is described as Example 2 of the radio-frequency circuit 1 according to the embodiment. Example 2 is different from Example 1 described above mostly in that power amplifiers 11 and 12 are disposed on a major surface 92*b*. The following description of the radio-frequency module 1B according to Example 2 focuses different points from Example 1 with reference to FIGS. 6 to 9.

[2.2.1 Component Position of Radio-Frequency Module 1B]

Figure 6:
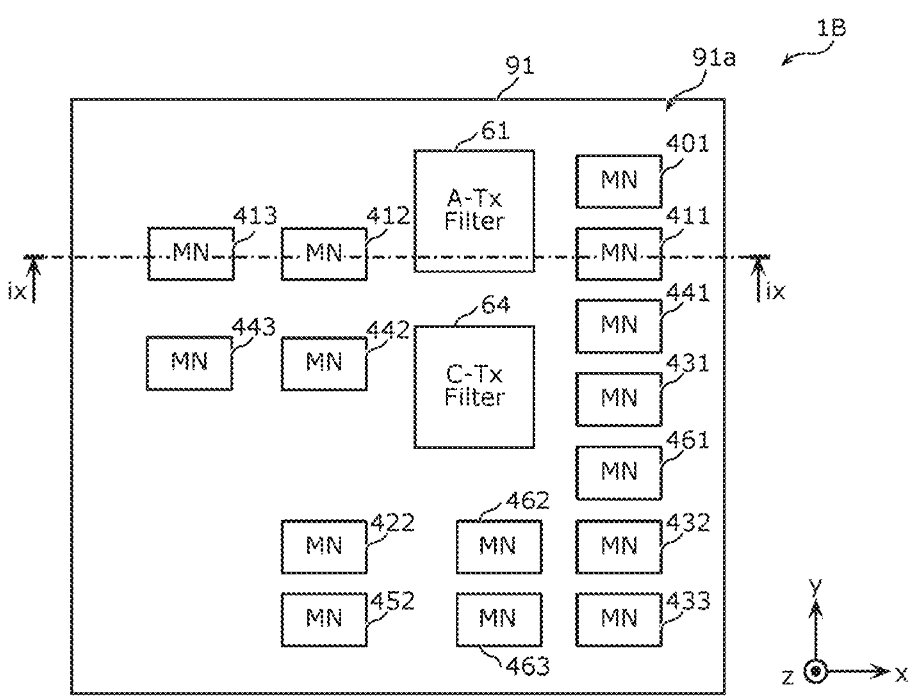
FIG. 6 is a plan view of a first major surface of a radio-frequency module according to Example 2.
Figure 7:
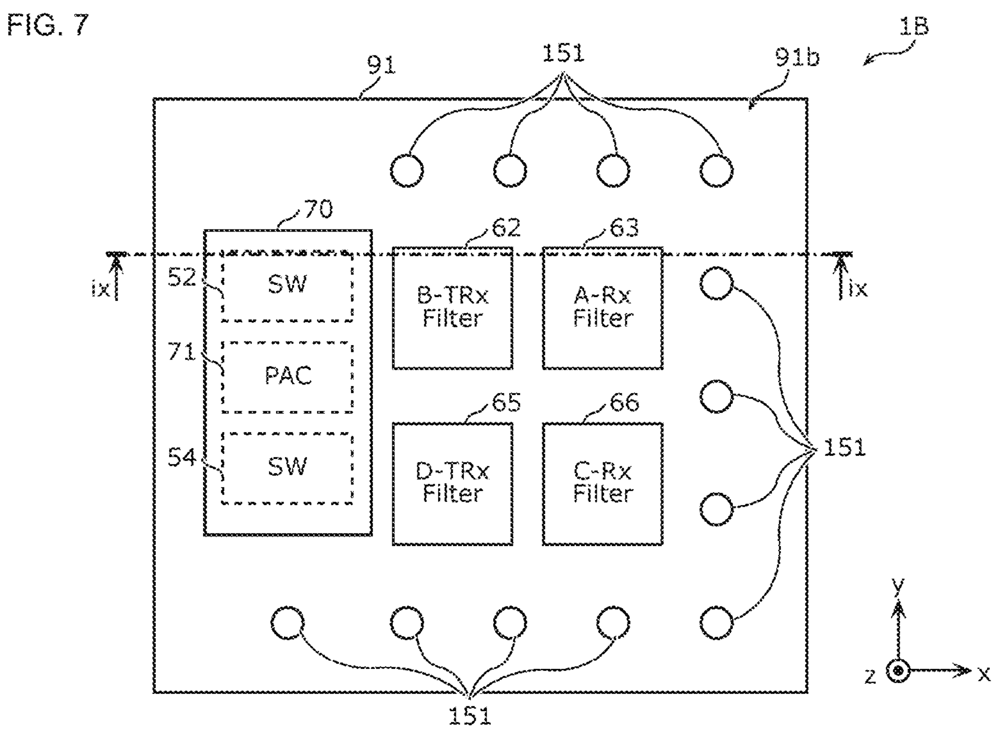
FIG. 7 is a plan view of a second major surface of the radio-frequency module according to Example 2.
Figure 8:
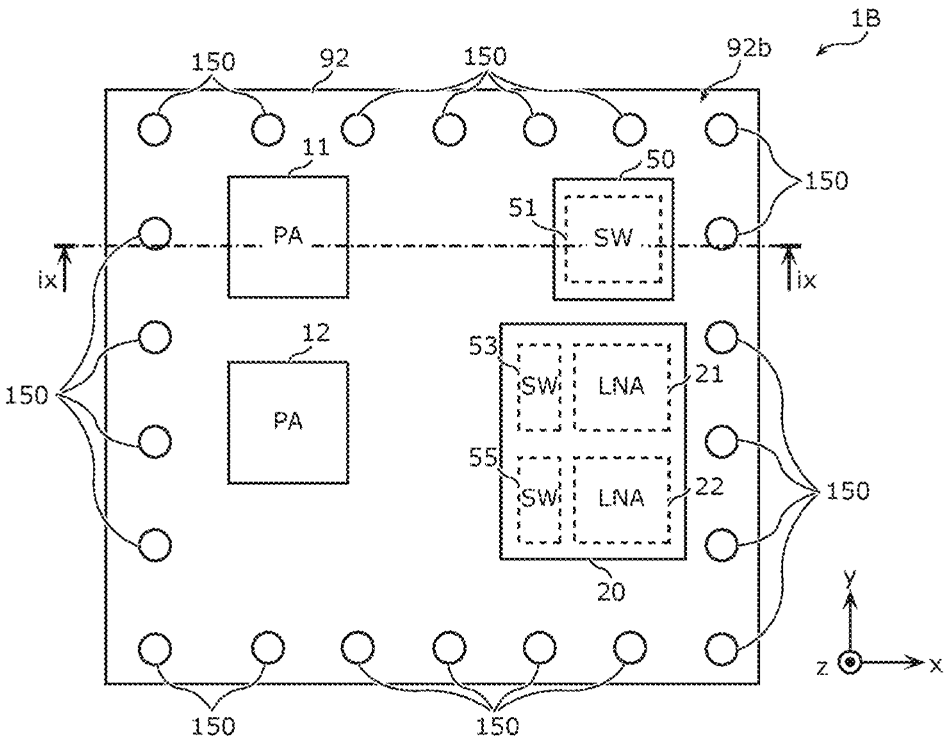
FIG. 8 is a cross-sectional view of a fourth major surface of the radio-frequency module according to Example 2.
Figure 9:
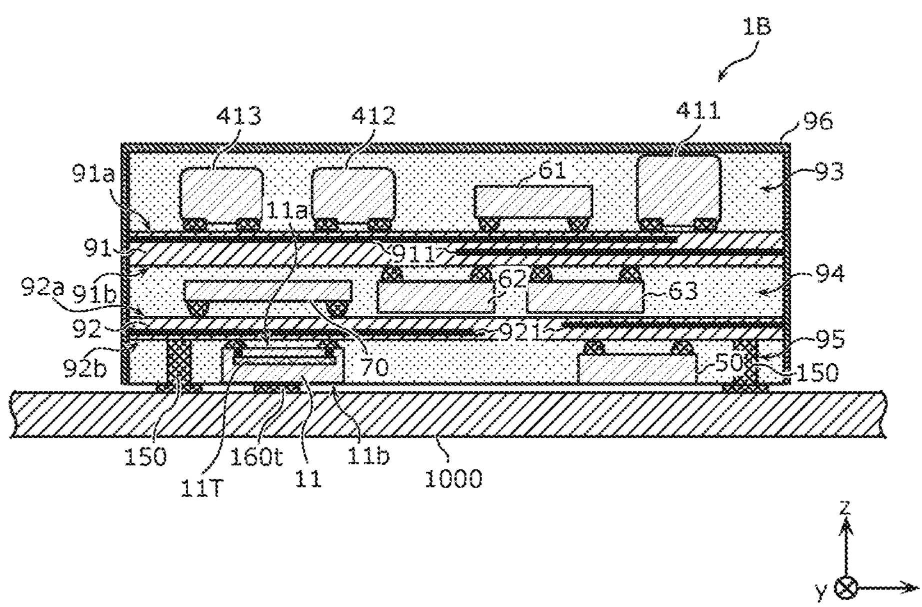
FIG. 9 is a cross-sectional view of the radio-frequency module according to Example 2.

FIG. 6 is a plan view of a major surface 91*a* of the radio-frequency module 1B according to Example 2. FIG. 7 is a plan view of a major surface 91*b* of the radio-frequency module 1B according to Example 2. FIG. 7 is a view seen through the major surface 91*b* side of a module substrate 91 as seen in the positive z-axis direction. FIG. 8 is a plan view of a major surface 92*b* of the radio-frequency module 1B according to Example 2. FIG. 8 is a view seen through the major surface 92*b* side of a module substrate 92 as seen in the positive z-axis direction. FIG. 9 is a cross-sectional view of the radio-frequency module 1B according to Example 2. The cross section of the radio-frequency module 1B in FIG. 9 is taken along a line ix-ix of FIGS. 6 to 8.

FIGS. 6 to 8 do not illustrate traces connecting plural electronic components disposed in the module substrates 91 and 92. FIGS. 6 to 8 do not illustrate the resin members 93 to 95, which cover plural electronic components, and the shield electrode layer 96, which covers the surfaces of the resin members 93 to 95.

In addition to the plural electronic components including the plural circuit elements illustrated in FIG. 1, the radio-frequency module 1B includes the module substrates 91 and 92, resin members 93 to 95, shield electrode layer 96, plural external connection terminals 150, plural heat dissipation conductors 160*t*, and plural inter-substrate connection terminals 151.

On the major surface 91*a* (the upper layer), matching networks 401, 411 to 413, 422, 431 to 433, 441 to 443, 452, and 461 to 463, and filters 61 and 64 are disposed.

Between the major surfaces 91*b* and 92*a* (the middle layer), an integrated circuit 70, filters 62, 63, 65, and 66, and the plural inter-substrate connection terminals 151 are disposed. Between the major surfaces 91*b* and 92*a*, the resin member 94 is injected and covers the electronic components disposed between the major surfaces 91*b* and 92*a*.

The integrated circuit 70 includes switches 52 and 54 and a PA controller 71. The circuit elements constituting the switches 52 and 54 and the PA controller 71 are formed on the circuit surface of the integrated circuit 70. The circuit surface can be, for example, the major surface of the integrated circuit 70 facing the module substrate 92. The integrated circuit 70 is electrically coupled to the module substrate 92 with electrodes interposed therebetween. The electrodes are provided on the side facing the module substrate 92.

Each of the filters 62, 63, 65, and 66 is electrically coupled to the module substrate 91 with electrodes interposed therebetween. The electrodes are provided on the side facing the module substrate 91.

On the major surface 92*b* (the lower layer), power amplifiers 11 and 12, integrated circuits 20 and 50, the plural external connection terminals 150, and the plural heat dissipation conductors 160*t* are disposed.

Each of the power amplifiers 11 and 12 includes an amplification transistor. The amplification transistor of the power amplifier 11 is formed in a circuit section 11T. As illustrated in FIG. 9, the circuit section 11T is formed at a position near the major surface 11*a* between the major surfaces 11*a* (fifth major surface) and 11*b* (sixth major surface) of the power amplifier 11, which face each other. The power amplifier 11 has the major surface 11*a* disposed facing the major surface 92*b*. Similarly, the amplification transistor of the power amplifier 12 is formed in a circuit section 12T. Although not illustrated, the circuit section 12T is formed at a position near the major surface 12*a* between the major surfaces 12*a* (fifth major surface) and 12*b* (sixth major surface) of the power amplifier 12, which face each other. The power amplifier 12 has the major surface 12*a* disposed facing the major surface 92*b*.

The plural heat dissipation conductors 160*t* overlap the power amplifiers 11 and 12 in a planar view and serve as heat dissipation electrodes of the power amplifiers 11 and 12. More specifically, as illustrated in FIG. 9, the plural heat dissipation conductors 160*t* each have one end joined to the major surface 11*b* of the power amplifier 11 or the major surface 12*b* of the power amplifier 12, and extend along a direction (negative z-axis direction) from the major surface 92*a* to the major surface 92*b*. The plural heat dissipation conductors 160*t* each have the other end exposed from the bottom surface of the resin member 95 and joined to the motherboard 1000. The plural heat dissipation conductors 160*t* may each have the other end joined to the motherboard 1000 by at least one of a metal electrode and solder. This can increase the heat dissipation of the power amplifiers 11 and 12.

The power amplifier 11 includes a first base member on the major surface 11*a* side where the circuit section is formed and a second base member on the major surface 11*b* side where the circuit section is not formed. It is preferable that the second base member has a thermal conductivity higher than that of the first base member. The power amplifier 12 includes a first base member on the major surface 12*a* side where the circuit section is formed and a second base member on the major surface 12*b* side where the circuit section is not formed. It is preferable that the second base member has a thermal conductivity higher than that of the first base member.

The integrated circuit 70 is disposed on the major surface 92*a*, and the power amplifiers 11 and 12 are disposed on the major surface 92*b*. In a planar view of the module substrate 92, the PA controller 71 and the power amplifiers 11 and 12 at least partially overlap each other.

The plural external connection terminals 150 include the antenna connection terminal 100, radio-frequency input terminals 111 and 112, radio-frequency output terminals 121 and 122, and control terminal 131, which are illustrated in FIG. 1, and further include ground terminals. The plural external connection terminals 150 are individually joined to input-output terminals, a ground terminal, and/or other terminals on the motherboard 1000, which is laid in the negative z-axis direction with respect to the radio-frequency module 1B. The plural external connection terminals 150 can be copper post electrodes, for example. However, the shape and material of the external connection terminals 150 are not limited thereto.

In the radio-frequency module 1B according to Example 2, when the power amplifier 11 is disposed on the major surface 92*b* and the matching network 413 (first inductor) is disposed on the major surface 92*a*, the matching network 413 and the power amplifier 11 may at least partially overlap each other in a planar view of the module substrate 92.

[2.2.2 Effect of Radio-frequency Module 1B]

As described above, the radio-frequency module 1B according to Example 2 includes: the module substrate 91, which includes the major surfaces 91*a* and 91*b* opposite to each other; the module substrate 92, which includes the major surfaces 92*a* and 92*b* opposite to each other, the major surface 92*a* being disposed facing the major surface 91*b*; the plural electronic components disposed between the major surfaces 91*b* and 92*a*, on the major surfaces 91*a*, and on the major surface 92*b*; and plural external connection terminals 150, which are disposed on the major surface 92*b*. The plural electronic components include the power amplifier 11. The power amplifier 11 has the major surfaces 11*a* and 11*b* facing each other, and includes the circuit section that is formed at a position closer to the major surface 11*a* than the major surface 11*b* and includes the amplification transistor. The power amplifier 11 has the major surface 11*a* disposed facing the major surface 91*b*. The heat dissipation conductors 160*t* extending along the direction from the major surface 92*a* to the major surface 92*b* are joined to the major surface 11*b*.

This can implement reduction in size of the radio-frequency module 1B and can increase the heat dissipation of the power amplifier 11.

In the radio-frequency module 1B according to Example 2, for example, the power amplifier 11 has the major surface 11*a* disposed facing the major surface 92*b*, and the plural electronic components further include the matching network 413 coupled to the output terminal of the power amplifier 11 and disposed on the major surface 92*a*. In a planar view of the module substrate 92, the matching network 413 and the power amplifier 11 may at least partially overlap each other.

According to such a configuration, the transmission path on the output side of the power amplifier 11 can be shortened. Thus, the transmission loss of transmission signals can be reduced.

In the radio-frequency module 1B according to Example 2, for example, the power amplifier 11 has the major surface 11*a* disposed facing the major surface 92*b*, and the plural electronic components further include the PA controller 71 that controls the power amplifier 11 and is disposed on the major surface 92*a*. In a planar view of the module substrate 92, the PA controller 71 and the power amplifier 11 may at least partially overlap each other.

According to such a configuration, since the power amplifier 11 and the PA controller 71 are disposed with the module substrate 92 interposed therebetween, the digital control signal inputted and outputted to and from the PA controller 71 can be prevented from flowing into the power amplifier 11 as digital noise. Since the control wiring connecting the power amplifier 11 to the PA controller 71 can be shortened, noise generated from the control wiring can be reduced.

In the radio-frequency module 1B according to Example 2, for example, the power amplifier 11 includes the first base member on the major surface 11*a* side where the circuit section is formed and the second base member on the major surface 11*b* side where the circuit section is not formed. The second base member may have a thermal conductivity higher than that of the first base member.

According to such a configuration, heat generated by the circuit section as a heat source can be dissipated to the motherboard 1000 via the second base member having a high thermal conductivity. This increases the heat dissipation of the radio-frequency module 1B.

For example, the radio-frequency module 1B according to Example 2 may have a bottom surface facing the motherboard 1000. The heat dissipation conductor 160*t* may have one end joined to the major surface 11*b* and the other end exposed from the bottom surface.

According to such a configuration, the heat dissipation conductor 160*t* joined to the power amplifier 11 can be joined directly to the motherboard 1000, thus increasing the heat dissipation of the power amplifier 11.

The communication device 5 according to Example 2 includes: the RFIC 3 that processes radio-frequency signals; and the radio-frequency module 1B that transmits radio-frequency signals between the RFIC 3 and the antenna 2.

According to such a configuration, the communication device 5 can achieve the effect of the radio-frequency module 1B.

[2.3 Example 3]

Next, a radio-frequency module 1C, in which the radio-frequency circuit 1 is implemented, is described as Example 3 of the radio-frequency circuit 1 according to the embodiment. Example 3 is different from Examples 1 and 2 described above mostly in being composed of a single module substrate. The following description of the radio-frequency module 1C according to Example 3 focuses different points from Example 1 with reference to FIGS. 10 to 13.

[2.3.1 Component Position of Radio-Frequency Module 1C]

Figure 10:
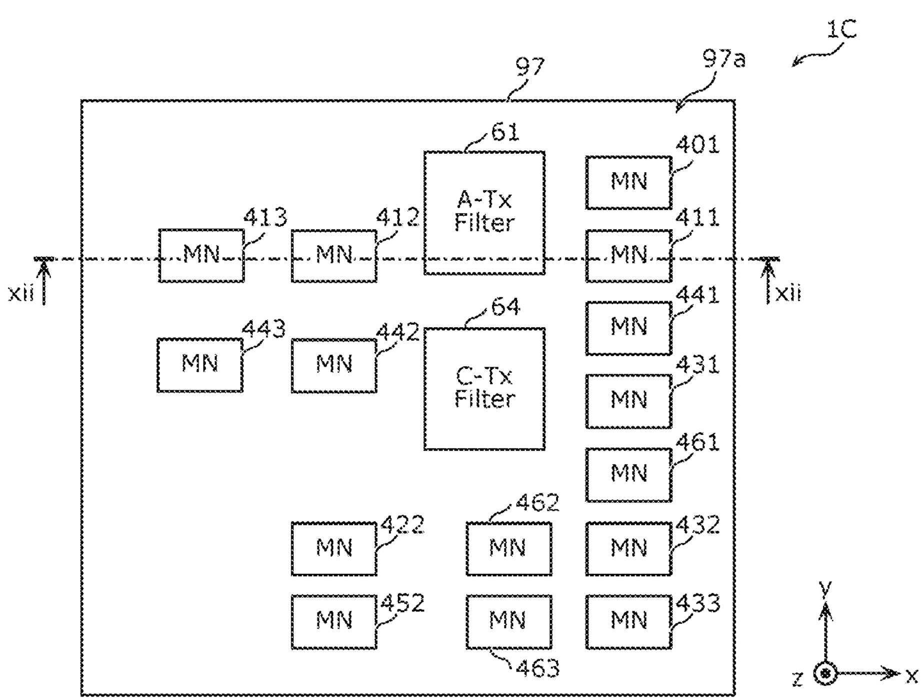
FIG. 10 is a plan view of a first major surface of a radio-frequency module according to Example 3.
Figure 11:
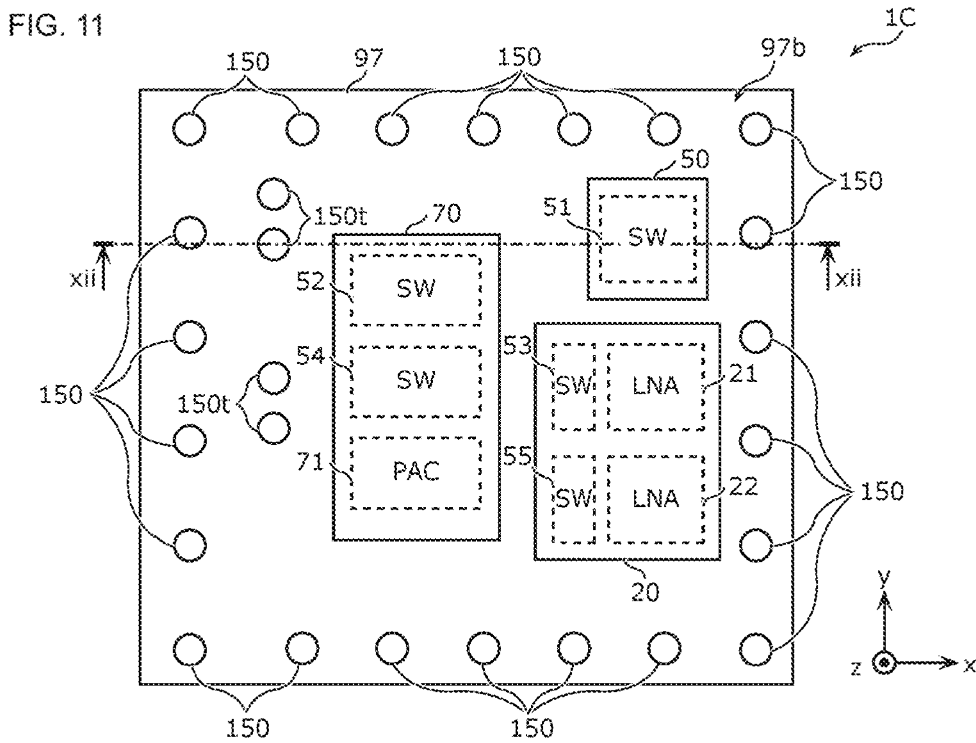
FIG. 11 is a plan view of a second major surface of the radio-frequency module according to Example 3.
Figure 12:
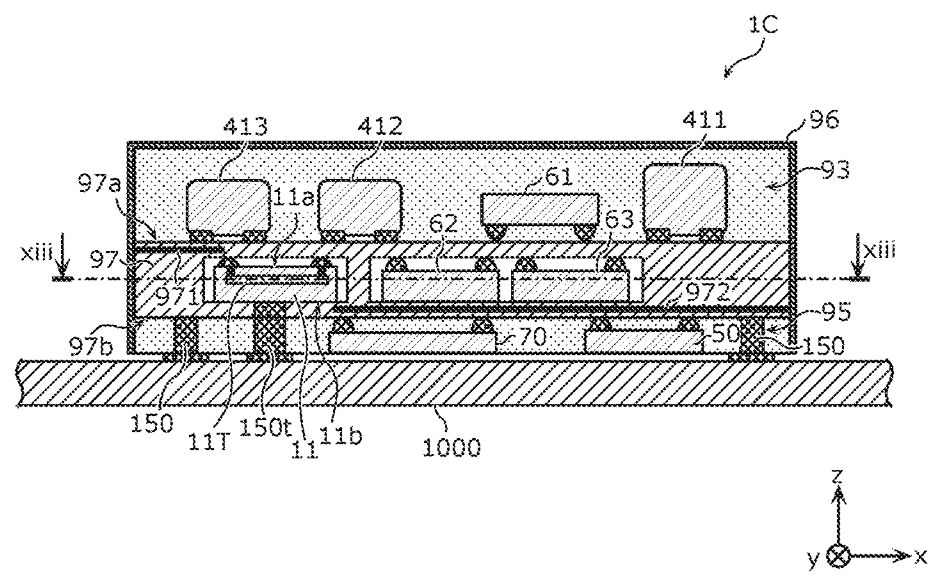
FIG. 12 is a cross-sectional view of the radio-frequency module according to Example 3.
Figure 13:
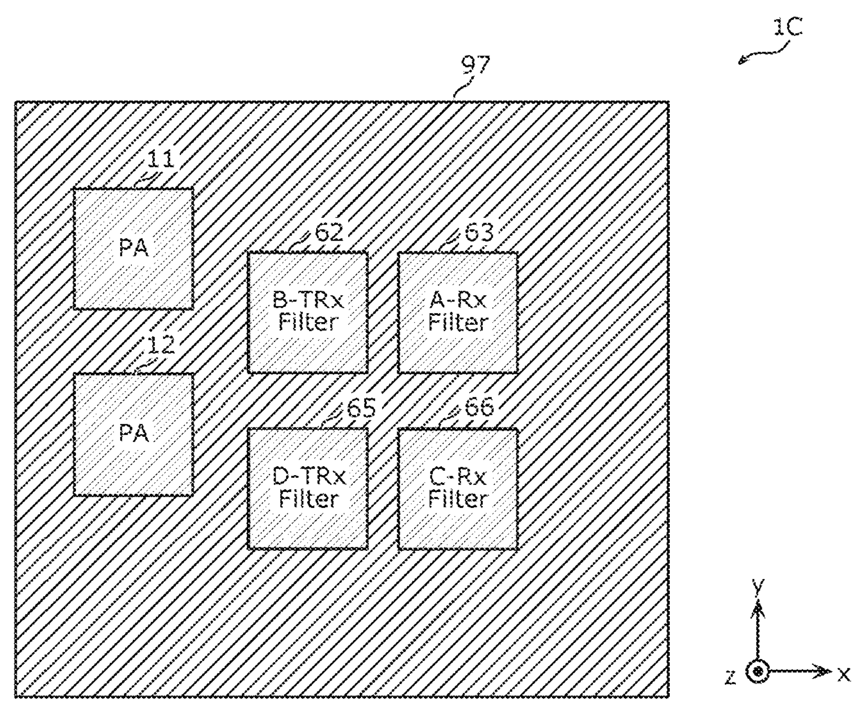
FIG. 13 is a cross-sectional view of the radio-frequency module according to Example 3.

FIG. 10 is a plan view of a major surface 97*a* of the radio-frequency module 1C according to Example 3. FIG. 11 is a plan view of a major surface 97*b* of the radio-frequency module 1C according to Example 3. FIG. 11 is a view seen through the major surface 97*b* side of a module substrate 97 as seen in the positive z-axis direction. FIG. 12 is a cross-sectional view of the radio-frequency module 1C according to Example 3. The cross section of the radio-frequency module 1C in FIG. 12 is taken along a line xii-xii of FIGS. 10 and 11. FIG. 13 is a cross-sectional view of the radio-frequency module 1C according to Example 3. The cross section of the radio-frequency module 1C in FIG. 13 is taken along a line xiii-xiii of FIG. 12.

Similarly to FIGS. 2 to 5, FIGS. 10 to 13 do not illustrate traces connecting plural electronic components disposed in the module substrates 97. FIGS. 10 and 11 do not illustrate the resin members 93 and 95, which cover plural electronic components, and the shield electrode layer 96, which covers the surfaces of the resin members 93 and 95.

In addition to the plural electronic components including the plural circuit elements illustrated in FIG. 1, the radio-frequency module 1C includes the module substrate 97, resin members 93 and 95, shield electrode layer 96, plural heat dissipation conductors 150*t*, and plural external connection terminals 150.

The module substrate 97 includes the major surfaces 97*a* and 97*b*, which are opposite to each other. The major surfaces 97*a* and 97*b* are examples of the first and second major surfaces, respectively. The module substrate 97 can be, but not limited to, an LTCC substrate, an HTCC substrate, an embedded printed circuit board, a substrate including an RDL, a printed circuit board, or the like, for example.

Inside the module substrate 97, ground conductors 971 and 972 may be formed in a direction parallel to the major surfaces 97*a* and 97*b*. This enhances the isolation between the electronic components disposed on the major surface 97*a* and the electronic components disposed on the major surface 97*b*.

On the major surface 97*a* (the upper layer), matching networks 401, 411 to 413, 422, 431 to 433, 441 to 443, 452, and 461 to 463, and filters 61 and 64 are disposed.

Each of the matching networks 401, 411 to 413, 422, 431 to 433, 441 to 443, 452, and 461 to 463 is composed of a chip inductor, for example. A chip inductor is an SMD that constitutes an inductor. The chip inductor is disposed on the major surface 97*a*. Each matching network may include not only a chip inductor but also a chip capacitor, and the positions of the chip capacitors are not limited. All the matching networks are not necessarily surface-mounted. For example, an inductor and/or a capacitor included in any matching network may be formed within the module substrate 97.

The filters 61 and 64 may be composed of, but not limited to, any one of the SAW filter, the BAW filter, the LC resonance filter, or a dielectric filter, for example.

The resin member 93 covers the major surface 97*a* and the electronic components on the major surface 97*a*. The resin member 93 has a function of enhancing the reliability, including mechanical strength and moisture resistance, of the electronic components on the major surface 97*a*. The resin member 93 does not need to be included in the radio-frequency module 1C.

Within the module substrate 97 (the middle layer), the power amplifiers 11 and 12, the filters 62, 63, 65, and 66, and the plural heat dissipation conductors 150*t* are disposed.

Each of the power amplifiers 11 and 12 includes an amplification transistor. The amplification transistor of the power amplifier 11 is formed in a circuit section 11T. As illustrated in FIG. 12, the circuit section 11T is formed at a position near the major surface 11*a* between the major surfaces 11*a* (third major surface) and 11*b* (fourth major surface) of the power amplifier 11, which face each other. The power amplifier 11 has the major surface 11*a* disposed closer to the major surface 97*a* than the major surface 97*b*. Similarly, the amplification transistor of the power amplifier 12 is formed in a circuit section 12T. Although not illustrated, the circuit section 12T is formed at a position near the major surface 12*a* between the major surfaces 12*a* (third major surface) and 12*b* (fourth major surface) of the power amplifier 12, which face each other. The power amplifier 12 has the major surface 12*a* disposed closer to the major surface 97*a* than the major surface 97*b*.

The filters 62, 63, 65, and 66 may be composed of, but not limited to, any one of a SAW filter, a BAW filter, an LC resonance filter, or a dielectric filter, for example.

In a planar view of the module substrate 97, the matching network 413 (first inductor) and the power amplifier 11 at least partially overlap each other. The matching network 443 (first inductor) and the power amplifier 12 at least partially overlap each other. Thus, the transmission path on the output side of the power amplifiers 11 and 12 can be shortened.

The power amplifier 11 includes a first base member on the major surface 11*a* side where the circuit section is formed and a second base member on the major surface 11*b* side where the circuit section is not formed. It is preferable that the second base member has a thermal conductivity higher than that of the first base member. The power amplifier 12 includes a first base member on the major surface 12*a* side where the circuit section is formed and a second base member on the major surface 12*b* side where the circuit section is not formed. It is preferable that the second base member has a thermal conductivity higher than that of the first base member.

On the major surface 97*b* (the lower layer), integrated circuits 20, 50, and 70, the plural external connection terminals 150, and the plural heat dissipation conductors 150*t* are disposed.

The plural heat dissipation conductors 150*t* overlap the power amplifiers 11 and 12 in a planar view and serve as heat dissipation electrodes of the power amplifiers 11 and 12. More specifically, as illustrated in FIGS. 11 and 12, the plural heat dissipation conductors 150*t* each have one end joined to the major surface 11*b* of the power amplifier 11 or the major surface 12*b* of the power amplifier 12, and extend along a direction (negative z-axis direction) from the major surface 97*a* to the major surface 97*b*. The plural heat dissipation conductors 150*t* each have the other end exposed from the bottom surface of the resin member 95 and joined to the motherboard 1000 by at least one of a metal electrode and solder. This can increase the heat dissipation of the power amplifiers 11 and 12. The heat dissipation conductors 150*t* are composed of, for example, a via conductor having a circular or elliptical cross section parallel to the module substrate 97 and a copper post electrode. However, the shape and material of the heat dissipation conductors 150*t* are not limited thereto.

The integrated circuit 20 includes the low-noise amplifiers 21 and 22 and switches 53 and 55. The circuit elements constituting the low-noise amplifiers 21 and 22 and the switches 53 and 55 are formed on the circuit surface of the integrated circuit 20. The circuit surface can be, for example, the major surface of the integrated circuit 20 facing the module substrate 97. The integrated circuit 70 includes the switches 52 and 54 and the PA controller 71. The circuit elements constituting the switches 52 and 54 and the PA controller 71 are formed on the circuit surface of the integrated circuit 70. The circuit surface can be, for example, the major surface of the integrated circuit 70 facing the module substrate 97. The integrated circuit 50 includes the switch 51. The switch 51 may be included in the integrated circuit 20 or 70.

The plural external connection terminals 150 include the antenna connection terminal 100, radio-frequency input terminals 111 and 112, radio-frequency output terminals 121 and 122, and control terminal 131, which are illustrated in FIG. 1, and further include ground terminals. The plural external connection terminals 150 are individually joined to input-output terminals, a ground terminal, and/or other terminals on the motherboard 1000, which is laid in the negative z-axis direction with respect to the radio-frequency module 1C.

The resin member 95 covers the major surface 97*b* and the electronic components on the major surface 97*b*. The resin member 95 has a function of enhancing the reliability, including mechanical strength and moisture resistance, of the electronic components on the major surface 97*b*. The resin member 95 does not need to be included in the radio-frequency module 1C.

In the radio-frequency module 1C according to Example 3, the integrated circuit 70 is disposed on the major surface 97*a* and the power amplifier 11 is disposed within the module substrate 97. In a planar view of the module substrate 97, the PA controller 71 and the power amplifier 11 may at least partially overlap each other.

[2.3.2 Effect of Radio-Frequency Module 1C]

As described above, the radio-frequency module 1C according to Example 3 includes: the module substrate 97, which includes the major surfaces 97*a* and 97*b* opposite to each other; the plural electronic components disposed on the major surface 97*a* and on the major surface 97*b*; the plural external connection terminals 150, which are disposed on the major surface 97*b*; and the power amplifier 11 disposed inside the module substrate 97. The power amplifier 11 includes the major surfaces 11*a* and 11*b* opposite to each other, and the circuit section that is disposed closer to the major surface 11*a* than the major surface 11*b* and includes the amplification transistor. The power amplifier 11 has the major surface 11*a* disposed closer to the major surface 91*a* than the major surface 11*b*. The heat dissipation conductor 150*t* extending along the direction from the major surface 97*a* to the major surface 97*b* is joined to the major surface 11*b*.

According to such a configuration, the plural electronic components are disposed on the major surface 97*a* and on the major surface 97*b*, and the power amplifier 11 is disposed inside the module substrate 97. This can implement reduction in area of the radio-frequency module 1C in a planar view, that is, reduction in size of the radio-frequency module 1C. Furthermore, since the power amplifier 11 is disposed inside the module substrate 97, the heat dissipation conductor coupled to the motherboard 1000 can be shortened compared to the case where the power amplifier 11 is disposed on the major surface 97*a*. This increases the heat dissipation. Since the heat radiation path of the power amplifier 11 is not disposed on the major surface 97*a*, the electronic components can be disposed in a region on the major surface 97*a* overlapping the power amplifier 11 in a planar view. This can implement reduction in size of the radio-frequency module 1C and can increase the heat dissipation of the power amplifier 11.

In the radio-frequency module 1C according to Example 3, for example, the plural electronic components further include the matching network 413 coupled to the output terminal of the power amplifier 11 and disposed on the major surface 97*a*. In a planar view of the module substrate 97, the matching network 413 and the power amplifier 11 may at least partially overlap each other.

According to such a configuration, the transmission path on the output side of the power amplifier 11 can be shortened. Thus, the transmission loss of transmission signals can be reduced.

In the radio-frequency module 1C according to Example 3, for example, the plural electronic components further include the PA controller 71 that controls the power amplifier 11 and is disposed on the major surface 97*a*. In a planar view of the module substrate 97, the PA controller 71 and the power amplifier 11 may at least partially overlap each other.

According to such a configuration, since the power amplifier 11 is disposed inside the module substrate 97 and the PA controller 71 is disposed on the major surface 97*a*, the digital control signal inputted and outputted to and from the PA controller 71 can be prevented from flowing into the power amplifier 11 as digital noise. Since the control wiring connecting the power amplifier 11 to the PA controller 71 can be shortened, noise generated from the control wiring can be reduced.

In the radio-frequency module 1C according to Example 3, for example, the power amplifier 11 includes the first base member on the major surface 11*a* side where the circuit section is formed and the second base member on the major surface 11*b* side where the circuit section is not formed. The second base member may have a thermal conductivity higher than that of the first base member.

According to such a configuration, heat generated by the circuit section as a heat source can be dissipated to the motherboard 1000 via the second base member having a high thermal conductivity. This increases the heat dissipation of the radio-frequency module 1C.

For example, the radio-frequency module 1C according to Example 3 may have a bottom surface facing the motherboard 1000. The heat dissipation conductor 150*t* may have one end joined to the major surface 11*b* and the other end exposed from the bottom surface.

According to such a configuration, the heat dissipation conductor 150*t* joined to the power amplifier 11 can be joined directly to the motherboard 1000, thus increasing the heat dissipation of the power amplifier 11.

The communication device 5 according to Example 3 includes: the RFIC 3 that processes radio-frequency signals; and the radio-frequency module 1C that transmits radio-frequency signals between the RFIC 3 and the antenna 2.

According to such a configuration, the communication device 5 can achieve the effect of the radio-frequency module 1C.

Modification

The radio-frequency module and communication device according to the present disclosure are described based on the embodiment and examples hereinabove but are not limited to the aforementioned embodiment and examples. The present disclosure includes another example implemented by a combination of any constituent elements of the aforementioned examples, modifications obtained by performing for the aforementioned embodiment and examples, various changes that can be conceived by those skilled in the art without departing from the spirit of the present disclosure, and various devices incorporating the aforementioned radio-frequency module.

In the circuit configurations of the radio-frequency circuit and communication device according to the aforementioned embodiments, for example, other circuit elements, traces, and the like may be inserted in paths connecting circuit elements and signal paths disclosed in the drawings. For example, a matching network may be inserted between the switch 51 and the filter 62 and/or between the switch 51 and the filter 65.

The positions of the plural electronic components are illustrated in the aforementioned examples by way of example and are not limited to the aforementioned examples. For example, the position of any electronic component in any of the aforementioned examples may be substituted with the position of the same electronic component in the other example.

The plural external connection terminals 150 are composed of copper post electrodes in the aforementioned examples but are not limited thereto. For example, the plural external connection terminals 150 may be bump electrodes. In this case, the radio-frequency module does not need to include the resin member 95.

INDUSTRIAL APPLICABILITY

The present disclosure can be widely used in communication devices, including mobile phones, as a radio-frequency module provided in the front end.

REFERENCE SIGNS LIST

1 RADIO-FREQUENCY CIRCUIT
1A, 1B, 1C RADIO-FREQUENCY MODULE
2 ANTENNA
3 RFIC
4 BBIC
5 COMMUNICATION DEVICE
11, 12 POWER AMPLIFIER
11*a*, 11*b*, 12*a*, 12*b*, 91*a*, 91*b*, 92*a*, 92*b*, 97*a*, 97 MAJOR SURFACE
11T, 12T CIRCUIT SECTION
20, 50, 70 INTEGRATED CIRCUIT
21, 22 LOW-NOISE AMPLIFIER
51, 52, 53, 54, 55 SWITCH
61, 62, 63, 64, 65, 66 FILTER
71 PA CONTROLLER
91, 92, 97 MODULE SUBSTRATE
93, 94, 95 RESIN MEMBER
96 SHIELD ELECTRODE LAYER
100 ANTENNA CONNECTION TERMINAL
111, 112 RADIO-FREQUENCY INPUT TERMINAL
121, 122 RADIO-FREQUENCY OUTPUT TERMINAL
131 CONTROL TERMINAL
150 EXTERNAL CONNECTION TERMINAL
150*t*, 160*t* HEAT DISSIPATION CONDUCTOR
151 INTER-SUBSTRATE CONNECTION TERMINAL
401, 411, 412, 413, 422, 431, 432, 433, 441, 442, 443, 452, 461, 462, 463 MATCHING NETWORK
511, 512, 513, 514, 515, 516, 517, 521, 522, 523, 524, 531, 532, 533, 541, 542, 543, 544, 551, 552, 553 TERMINAL
911, 921, 971, 972 GROUND CONDUCTOR
1000 MOTHERBOARD

The invention claimed is:

1. A radio-frequency module, comprising:
a first module substrate including a first major surface and a second major surface that are opposite to each other;
a second module substrate including a third major surface and a fourth major surface that are opposite to each other, the third major surface being disposed facing the second major surface;
a plurality of electronic components disposed between the second major surface and the third major surface, on the first major surface, and on the fourth major surface; and
a plurality of external connection terminals disposed on the fourth major surface, wherein
the plurality of electronic components include a power amplifier,
the power amplifier includes
a fifth major surface and a sixth major surface that are opposite to each other and
a circuit section that is formed at a position closer to the fifth major surface than the sixth major surface, and includes an amplification transistor,
the power amplifier has the fifth major surface disposed facing the second major surface or the fourth major surface, and
a heat dissipation conductor extending along a direction from the third major surface to the fourth major surface is joined to the sixth major surface.

2. The radio-frequency module according to claim 1, wherein
the plurality of electronic components further include a first inductor coupled to an output terminal of the power amplifier and disposed on the first major surface, and
in a planar view of the first module substrate, the first inductor and the power amplifier at least partially overlap each other.

3. The radio-frequency module according to claim 2,
the power amplifier includes
a first base member on the fifth major surface side where the circuit section is formed and
a second base member on the sixth major surface side where the circuit section is not formed, and
the second base member has a thermal conductivity higher than a thermal conductivity of the first base member.

4. The radio-frequency module according to claim 3, further comprising:
a bottom surface facing an external substrate, wherein
the heat dissipation conductor has one end joined to the sixth major surface and the other end exposed from the bottom surface.

5. The radio-frequency module according to claim 1, wherein
the power amplifier has the fifth major surface disposed facing the fourth major surface,
the plurality of electronic components further include a first inductor coupled to an output terminal of the power amplifier and disposed on the third major surface, and
in a planar view of the second module substrate, the first inductor and the power amplifier at least partially overlap each other.

6. The radio-frequency module according to claim 5,
the power amplifier includes
a first base member on the fifth major surface side where the circuit section is formed and
a second base member on the sixth major surface side where the circuit section is not formed, and
the second base member has a thermal conductivity higher than a thermal conductivity of the first base member.

7. The radio-frequency module according to claim 6, further comprising:
a bottom surface facing an external substrate, wherein
the heat dissipation conductor has one end joined to the sixth major surface and the other end exposed from the bottom surface.

8. The radio-frequency module according to claim 1, wherein
the plurality of electronic components further include a controller that controls the power amplifier and is disposed on the first major surface, and in a planar view of the first module substrate, the controller and the power amplifier at least partially overlap each other.

9. The radio-frequency module according to claim 8, the power amplifier includes a first base member on the fifth major surface side where the circuit section is formed and a second base member on the sixth major surface side where the circuit section is not formed, and the second base member has a thermal conductivity higher than a thermal conductivity of the first base member, wherein the radio-frequency module further comprises:

a bottom surface facing an external substrate, wherein the heat dissipation conductor has one end joined to the sixth major surface and the other end exposed from the bottom surface.

10. The radio-frequency module according to claim 1, wherein the power amplifier has the fifth major surface disposed facing the fourth major surface, the plurality of electronic components further include a controller that controls the power amplifier and is disposed on the third major surface, and in a planar view of the second module substrate, the controller and the power amplifier at least partially overlap each other.

11. The radio-frequency module according to claim 10, the power amplifier includes a first base member on the fifth major surface side where the circuit section is formed and a second base member on the sixth major surface side where the circuit section is not formed, and the second base member has a thermal conductivity higher than a thermal conductivity of the first base member.

12. The radio-frequency module according to claim 11, further comprising:

a bottom surface facing an external substrate, wherein the heat dissipation conductor has one end joined to the sixth major surface and the other end exposed from the bottom surface.

13. A communication device comprising:

a signal processing circuit that processes radio-frequency signals; and the radio-frequency module according to claim 1 that transmits the radio- frequency signals between the signal processing circuit and the antenna.

14. The radio-frequency module according to claim 1, the power amplifier includes a first base member on the fifth major surface side where the circuit section is formed and a second base member on the sixth major surface side where the circuit section is not formed, and the second base member has a thermal conductivity higher than a thermal conductivity of the first base member.

15. The radio-frequency module according to claim 14, further comprising:

a bottom surface facing an external substrate, wherein the heat dissipation conductor has one end joined to the sixth major surface and the other end exposed from the bottom surface.

* * * * *